United States Patent [19]

Adcock

[11] Patent Number: 5,033,018
[45] Date of Patent: Jul. 16, 1991

[54] FILTER AND METHOD FOR WHITENING DIGITALLY GENERATED NOISE

[75] Inventor: James L. Adcock, Seattle, Wash.

[73] Assignee: Hewlett-Packard Company, Palo Alto, Calif.

[21] Appl. No.: 547,539

[22] Filed: Jun. 28, 1990

Related U.S. Application Data

[63] Continuation of Ser. No. 344,190, Apr. 26, 1989, abandoned.

[51] Int. Cl.$^5$ .............................................. G06F 15/31
[52] U.S. Cl. ................................................ 364/724.01
[58] Field of Search .................... 364/724.01, 724.16, 364/717, 717.5; 381/43

[56] References Cited

U.S. PATENT DOCUMENTS

| | | | |
|---|---|---|---|
| 4,356,558 | 10/1982 | Owen et al. | 364/724.01 |
| 4,573,135 | 2/1986 | Dieterich | 364/724.01 |
| 4,703,447 | 10/1987 | Lake, Jr. | 364/724 |
| 4,760,542 | 7/1988 | Mehrgardt et al. | 364/724.01 |
| 4,811,260 | 3/1989 | Abe et al. | 364/724.01 |

*Primary Examiner*—Dale M. Shaw
*Assistant Examiner*—Long T. Nguyen

[57] ABSTRACT

A digital filter for prewhitening digital noise is realized without the need to perform multiplication or division operations to weight any of the digital samples. Instead, the data samples that need weighting are bit shifted to achieve multiplication or division by a power of two. In the preferred embodiment, the filtering function is $1-z/8$, where z is a single sample delay. This function is implemented by bit shifting one sample three bits to the right and computing the difference between it and an adjacent sample.

8 Claims, 5 Drawing Sheets

$K_1 = 1$ $K_2 = -1/8$ $K_3$, etc = 0

FILTER AND METHOD FOR WHITENING DIGITALLY GENERATED NOISE

RELATED APPLICATION DATA

This application is a continuation of application Ser. No. 07/344,190, filed Apr. 26, 1989, now abandoned.

FIELD OF THE INVENTION

The present invention relates to digital noise sources, and more particularly relates to a method and apparatus for whitening the noise generated by such sources.

BACKGROUND AND SUMMARY OF THE INVENTION

Random noise is used advantageously in a variety of applications, such as in exciting electrical or mechanical systems under test. In such applications, the system's response to the noise stimulus can be analyzed to predict the system's response to a multitude of other conditions for which individual testing is impractical.

Important in such analyses is the requirement that the spectral distribution of energy in the noise signal be constant throughout the frequency range of interest. If it is not, then subsequent analysis cannot determine whether a system's particularly strong response at one noise frequency was due to a resonance at that frequency or whether the noise signal simply had a local maximum at that frequency component, prompting an exaggerated response. While a noise signal with a uniform spectral power distribution may be simple to conceptualize, it is often not simple to realize.

A common technique for generating relative low frequency noise (as opposed to microwave noise and the like) is to periodically produce a digital random number and convert it into analog form using a digital-to-analog converter (DAC). The analog signal output by the DAC changes at periodic intervals as new random numbers are provided to it, resulting in a time varying "noise" signal. This approach is termed the uniformly distributed digital random number technique.

The periodic operation of this random number generator affects the frequency spectrum of the resulting noise signal. For example, if a new random number is provided to the DAC every four microseconds, the resulting noise signal will have a nominal bandwidth of (¼ microseconds), or 250 kilohertz. Above 250 kilohertz, the power output by the DAC begins to rolloff more and more. Even below 250 kilohertz, the noise is not perfectly flat but begins to diminish with frequency. These irregularities are due to a phenomenon commonly known as sin(x)/x rolloff, which is present because the random numbers are produced periodically and the analog samples corresponding thereto are held constant for the periodic interval. (Sin(x)/x is the Fourier transform of a constant signal of finite duration.) Elimination of this phenomenon would require that ideal impulses of voltage be output by the DAC, a feat that cannot be realized in practice.

Sin(x)/x rolloff is not entirely disadvantageous. It tends to limit the power of the noise to a certain bandwidth that can be controlled by setting the "sampling frequency" —— the update rate of the DAC. However, at the corner frequency of the sin(x)/x rolloff (250 kilohertz in the above example), the response of the noise is already several dB down. Ideally, this non-flatness in-band would be limited to less than a dB.

This rolloff problem can be overcome by filtering the noise signal with a filter whose passband characteristics compensates for the sin(x)/x droop, resulting in an approximately flat response over the frequency band of interest. Such filters are termed "prewhitening" filters and are typically implemented in digital form for use in the digital portion of the noise generator.

As is known in the art, digital filters operate by summing a weighted series of data samples. The weighting coefficients are selected to achieve a desired passband characteristic. Unfortunately, digital filters are usually complex and expensive. For example, such a filter must usually perform several multiplication or division operations per cycle to weight the samples in their proper relationship. These operations are computationally intensive and time consuming. Due to the poor performance of conventional microprocessors at these tasks, specialized hardware that has been optimized to execute the filtering operations is usually required. Such specialized hardware is economically impractical to use in many applications, such as in simple noise sources.

The present invention provides the advantages of digital filtering without the usual high cost and complexity. This is accomplished by selecting a filter characteristic that can be implemented without performing any multiplication or division operations.

In particular, the present invention implements a filtering function expressed as $1 - z/8$, where z represents a single sample delay. The weighting coefficients are thus 1 and $\frac{1}{8}$. The "1" coefficient requires no multiplication. Multiplication by the "$\frac{1}{8}$" coefficient is effected by simply bit shifting the data sample three bits to the right. The subtraction operation is conventional and can be easily effected by a simple CPU. The result is a fast and simple prewhitening filter that can be easily implemented without any custom hardware.

The foregoing and additional features and advantages of the present invention will be more readily apparent from the following detailed description thereof, which proceeds with reference to the accompanying drawings.

DETAILED DESCRIPTION

Figure 1:
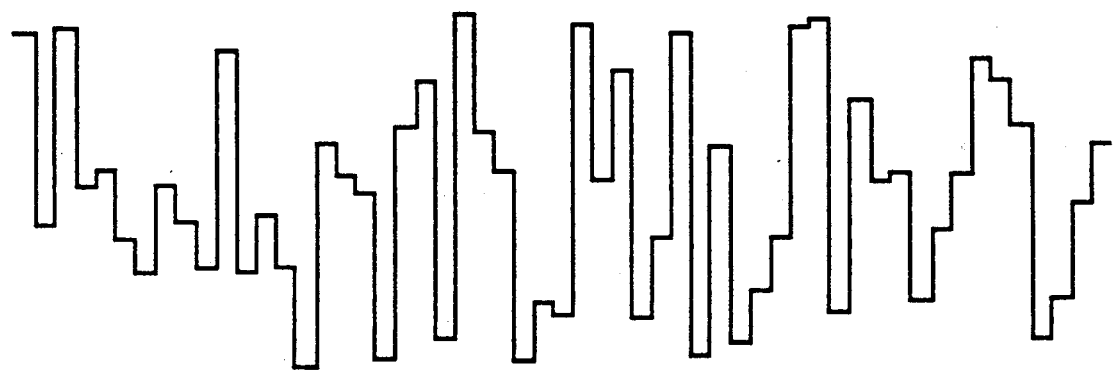
FIG. 1 shows a representative prior art noise waveform generated using a uniformly distributed digital random number approach.
Figure 2:
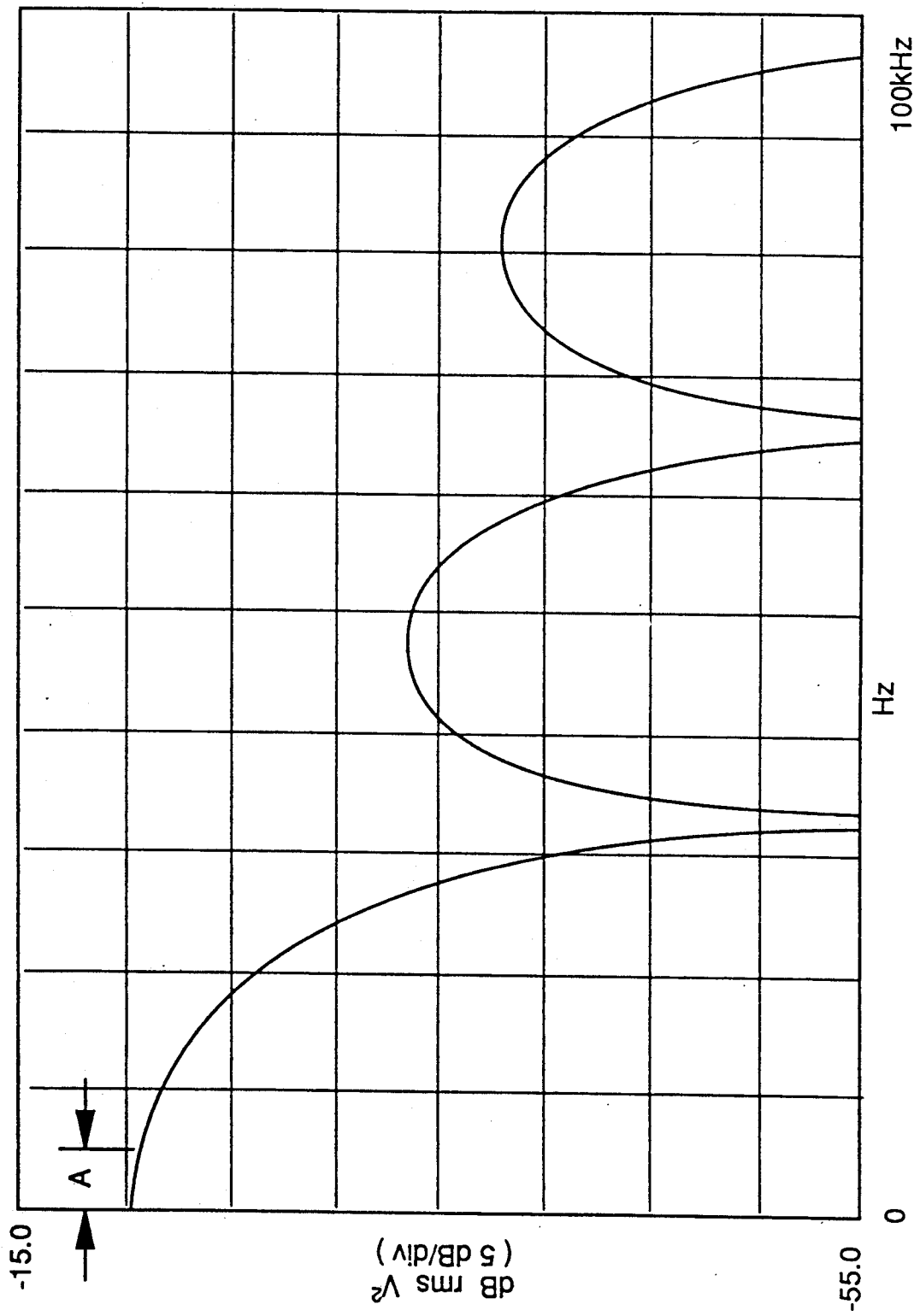
FIG. 2 shows the spectral distribution of the FIG. 1 waveform.

FIG. 1 shows a representative prior art noise waveform. As noted, such waveforms are conventionally generated by periodically computing a digital random number and converting the number to analog form using a digital-to-analog converter. The spectral distribution of such a waveform is shown in FIG. 2, which clearly illustrates the sin(x)/x function.

As discussed earlier, some prior art techniques have sought to mitigate the sin(x)/ effect by processing the digital samples through complex prewhitening filters. Other applications use the rippled noise signal to stimulate the system under test, but only analyze the system's response over the range across which the noise spectrum is relatively flat (i.e. the range bracketed and labelled "A" in FIG. 2).

Figure 3:
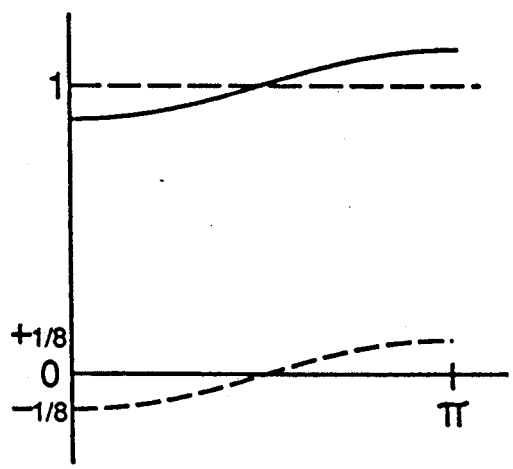
FIG. 3 shows the passband response of a prewhitening filter according to one embodiment of the present invention.

An ideal filter for compensating the sin(x)/x noise distribution would exhibit a passband characteristic of x/sin(x) and would extend the usable noise bandwidth of the source up to the first null in the noise spectrum. However, this passband cannot be realized simply. The present invention uses instead a passband function that can be realized simply and yet offers first order compensation for the sin(x)/x noise function. This function is $F_N = R_N - R_{N-1}/8$, where $F_N$ is the filtered noise sample, and $R_N$ and $R_{N-1}$ are sequential random noise samples. The passband of this function can be determined by decomposing the function into its component parts. The passband of the origin impulse $R_N$ is 1 over all frequencies. The passband of the $(-\frac{1}{8})$ impulse at $T=1$ is $-\cos\omega/8$, which rises from $-\frac{1}{8}$ to $\frac{1}{8}$ over the frequency range 0 to $\pi$. The summed passband is shown in FIG. 3 in solid lines; the two decomposed passbands are shown in dashed lines. For low frequency noise (i.e. less than about $(\pi/2)/3$, it will be recognized that the gradual increase in the passband response with frequency closely counteracts the gradual decrease in the sin(x)/x function over the same range. The result is a virtually flat noise spectrum over the widened frequency range labeled 'B.'

Figure 4:
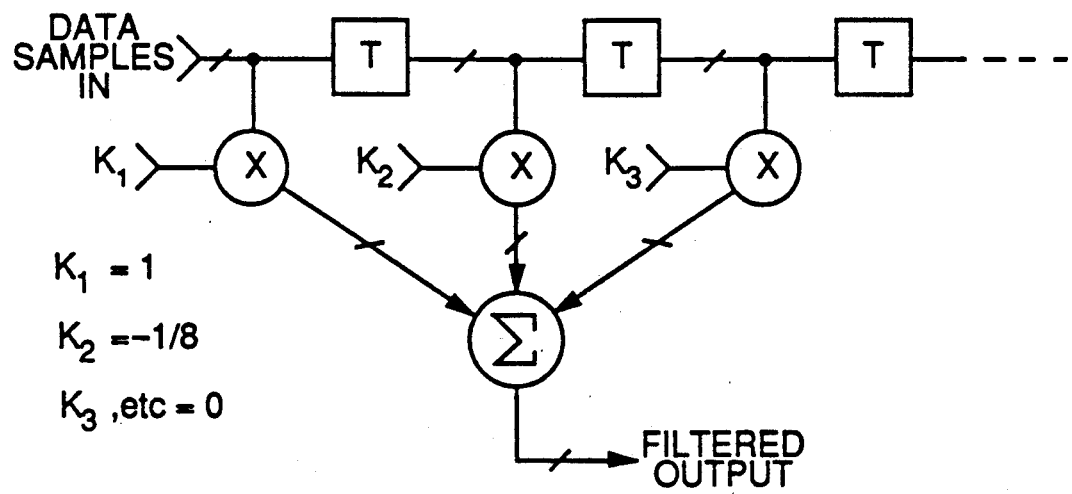
FIG. 4 shows a prewhitening filter according to one embodiment of the present invention represented in conventional digital filter topology.

Digital filters are conventionally implemented by cascading delay stages with output taps at the different stages. Delayed signal samples from the different taps are applied to respective weighting circuits and the weighted samples are summed to form respective filtered output samples from the filter. FIG. 4 shows the present filter function represented in this conventional filter topology. As can be seen, such an arrangement requires the use of at least one multiplier stage to accomplished the weighting by a factor of $-\frac{1}{8}$.

In the present invention, by contrast, this weighting operation is accomplished by bit shifting the delayed sample 3 bits to the right. Bit shifting operations are included in the instruction set of even the most rudimentary microprocessors and execute very quickly. The calculation of the difference between the delayed, bit shifted sample with the current sample is also an operation that any microprocessor can perform quickly.

Figure 5:
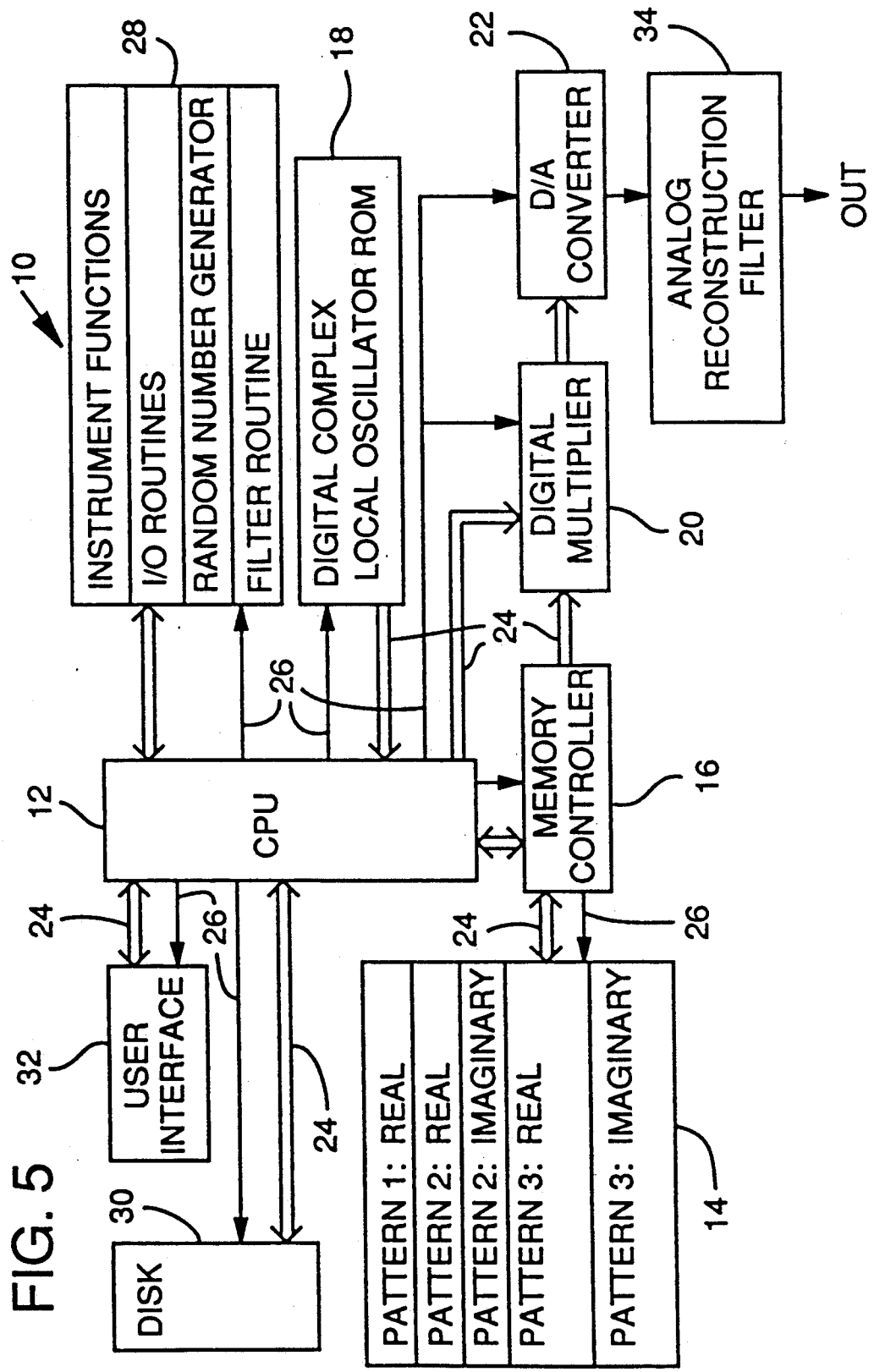
FIG. 5 shows an apparatus for producing prewhitened noise according to the present invention.
Figure 7:
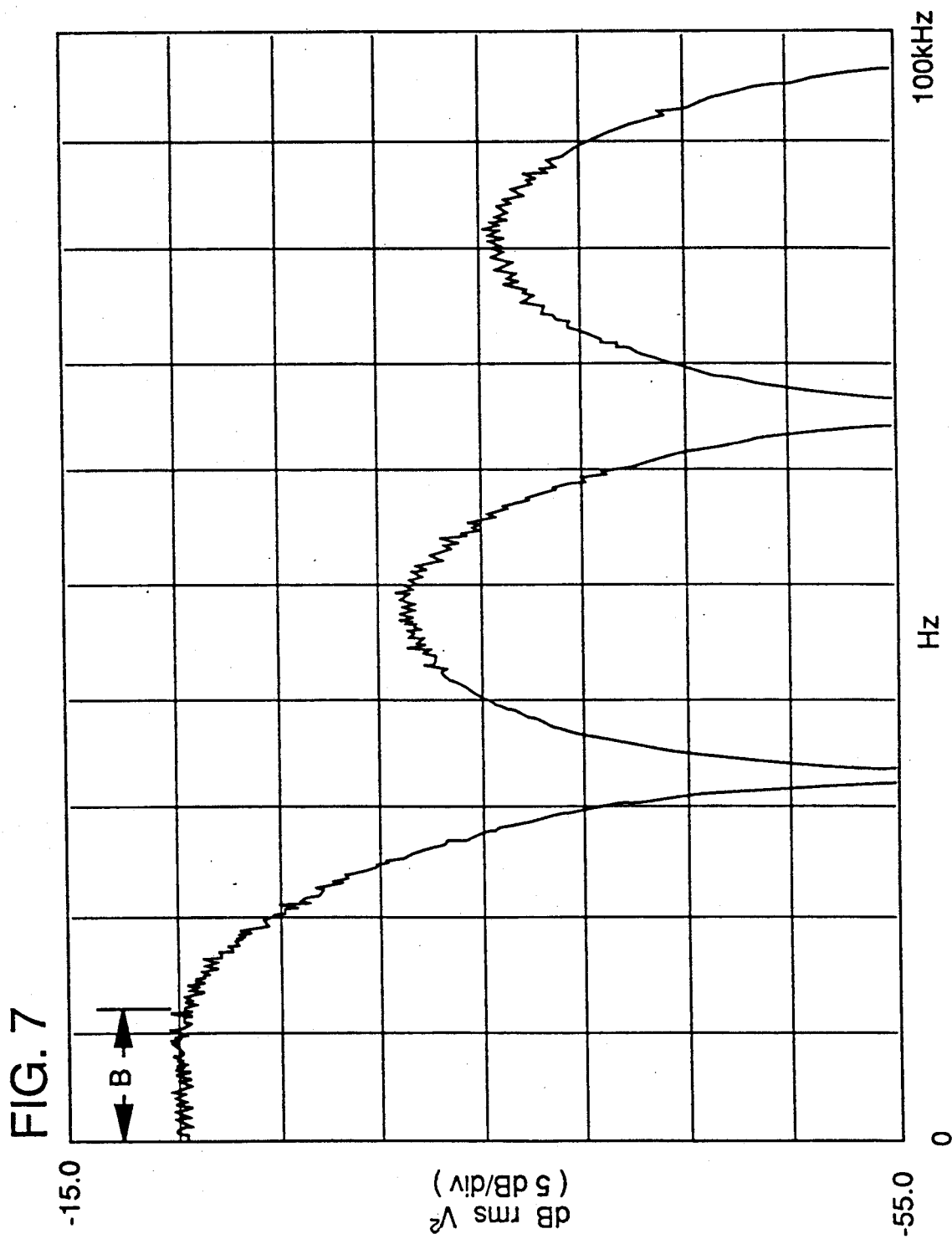
FIG. 7 shows the spectral distribution of a noise source that has been prewhitened using a filter according to one embodiment of the present invention.

An apparatus 10 for generating and filtering a noise sequence according to the present invention is shown in FIG. 5. Although not necessary to the present invention, illustrated apparatus 10 includes a digital mixer for translating the noise spectrum up from baseband to a desired frequency of interest.

Apparatus 10 comprises a control microprocessor 12 with associated memory and I/O, a pattern memory 14, a pattern memory controller 16, a digital local oscillator 18, a digital multiplier 20 and a digital-to-analog converter 22. These elements are interconnected by data buses 24 and control lines 26.

Figure 6:
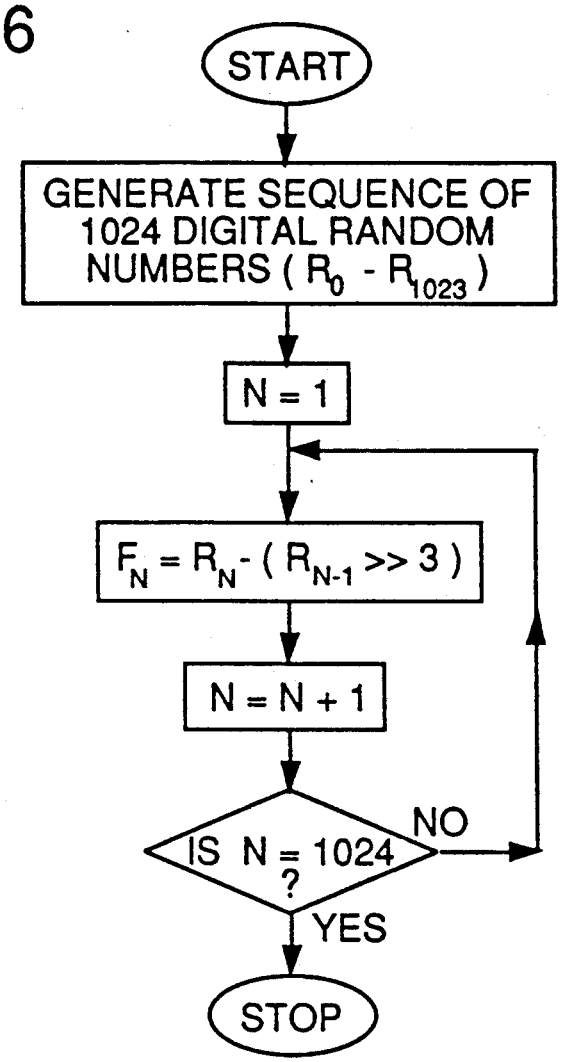
FIG. 6 shows a flowchart of a filter process according to one embodiment of the present invention.

The control microprocessor 12 in the illustrated embodiment is a Motorola 68000 series CPU that controls most of the functions of a host instrument in which the noise source 10 is embodied. Associated with CPU 12 is a memory 28 in which I/O and instrument operation routines are stored. Also included in this memory are the random number generator routine and the prewhitening filter routine. FIG. 6 is a flowchart illustrating the prewhitening filter routine. The random number generator routine is conventional and many such routines are known in the art.

Pattern memory 14 is a static RAM that can be loaded with noise samples produced by CPU 12 in accordance with the above-described process. This memory has space sufficient to store several such noise sequences or may also store other signal waveforms, such as a chirp or the like. Provision is made for storing complex pattern data, although the noise sequences generated according to the present invention are purely real.

Control microprocessor 12 can be used to control all aspects of the pattern memory's operation. However, in the preferred embodiment, additional memory controller circuitry 16 is provided to reduce the processing burden on the CPU. This controller circuitry includes several subcircuits, such as a Source Address Register, a DMA Load Counter, a RAM Run Counter, a Data Register and an End of Cycle Detector.

The Source Address Register indicates to the CPU the base address in pattern memory 14 at which to begin loading an incoming noise sequence. The DMA Load Counter indexes from this base address to indicate the successive locations in the pattern memory in which bytes of an incoming sequence are to be stored. The Memory Run Counter performs the analogous function during the reading of the sequence from the pattern memory, indexing successive memory locations from which sequence samples are to be read. The Data Register holds incoming pattern data that is be loaded into the pattern RAM until the RAM is ready to allow the transfer. This register permits the RAM to output a sequence without delaying the CPU if the CPU simultaneously needs to download a new sequence into the RAM. Finally, the End of Cycle Detector selects the length of the sequence that is to be read from the pattern memory. In the illustrated embodiment, the noise sequence stored in RAM can be from 256 to 32768 points long, in powers of two. When the End of Cycle Detector indicates that a complete sequence has been played back, a variety of operations can be initiated. The sequence can start playing back again from the beginning, causing a repetitive noise signal to be generated. Alternatively, the waveform can be turned off, causing a "single shot" noise burst. Still further, a signal can be sent to the CPU 12 to trigger execution of another function.

Noise sequence data output from the memory 14 is provided to a digital multiplier 20 that multiplies the noise sequence with a data stream corresponding to a complex sinusoid from local oscillator 18. Local oscillator 18 is a ROM based source that operates in conjunction with CPU 12 to provide a local oscillator data stream. The mixing of these two data streams serves to translate the baseband noise sequence to a higher frequency.

The digital data stream output from the multiplier 20 is converted to analog form using a digital-to-analog converter (DAC) 22. Since the DAC holds each sample for a finite time period (corresponding to the apparatus's 262,144 Hz sampling rate), a sin(x)/x term is introduced into the output signal's frequency spectrum. This ripple is removed by an analog reconstruction filter 34 dedicated to this particular function. Filter 34 also serves to suppress sidebands and harmonics of the desired output signal. The filtered analog noise signal is then output from the instrument for application to the system under test.

It will be recognized that the process of the present invention can be used on a continuous basis to filter in real time an unending stream of digital random numbers as they are produced. In one such implementation, the filtering process is embedded in the routine that generates the random numbers itself and is executed as part of the generation process. In other embodiments, a limited set of random numbers is generated and processed to effect the filtering operation. This latter process is illustrated in FIG. 6. A set of 1024 random number samples $R_N$ is calculated and is processed to yield a corresponding set of filtered samples $F_N$.

Having described and illustrated the principles of my invention with reference to a preferred embodiment thereof, it will be apparent that the invention can be modified in arrangement and detail without departing from such principles. For example, while the bit shifting and subtracting operations needed to implement the preferred filtering operation are illustrated as being performed by a microprocessor, in alternative embodiments other components may be used. In one such alternative embodiment, for example, a shift register is used to perform the bit shifting operation. The subtracting operation is performed by converting the shifted sample and the unshifted sample into analog form and using an analog operational amplifier to determine the difference. The output signal is then already in analog form. Similarly, while the preferred implementation of the invention uses the filter function $1 - z/8$ (where z is a single sample delay), other functions can readily be used with comparable effect. Such other functions include, by way of example, $\frac{1}{8} - z$; $1 - 8z$; $8 - 1z$; $16 - 2z$, etc, etc.

In view of the wide variety of embodiments to which the principles of my invention can be applied, it should be recognized that the illustrated embodiment is to be considered exemplary only and not as limiting the scope of my invention. Instead, I claim as my invention all such modifications as may come within the scope and spirit of the following claims and equivalents thereto.

I claim:

1. A method of generating a whitened noise signal, the method comprising the application of an algorithm to a signal processing methodology:
   I. wherein the signal processing methodology comprises:
   (A) using a signal source to generate a sequence of digital electrical signals corresponding to a sequence of uniformly distributed independent random numbers, the uniform distribution and independence of said numbers corresponding to a flat spectral response;
   (B) using a signal processor coupled to the signal source to process said sequence of digital electrical signals according to an algorithm, detailed below, to yield a sequence of prewhitened digital electrical signals; and
   (C) applying the prewhitened digital electrical signals, seriatim, to a digital-to-analog converter that is coupled to the signal processor to produce a time varying analog electrical signal therefrom, the digital-to-analog converter performing the following functions:
   (a) converting each of said prewhitened digital electrical signals into an analog signal having an amplitude corresponding thereto;
   (b) holding said analog signal at said corresponding amplitude for a finite time interval; and
   (c) introducing a ripple in a spectral distribution of the time varying analog electrical signal; and
   II. wherein the algorithm comprises repeating the following two steps with different of the digital electrical signals as first and second data:
   (i) weighting the first and second data in a one to eight ratio; and
   (ii) computing a difference between the weighted first and second data and producing one of said prewhitened digital electrical signals therefrom.

2. The method of claim 1 in which step (C) comprises applying the prewhitened digital electrical signals, seriatim, to the digital-to-analog converter at a uniform rate.

3. An apparatus comprising:
   a source for providing sampled digital data signals, the sampled data signals corresponding to uniformly distributed independent N-bit digital noise words, the uniform distribution and independence of said noise words corresponding to a flat spectral response, but the sampled nature thereof introducing a $\sin(x)/x$ ripple thereto;
   a bit shifter having an input for receiving a sampled digital data signal from the source and having an output, the output providing an output digital data signal corresponding to the input data signal shifted by three bits, the bit shifter thereby weighting the value of the input data signal by a factor of eight; and
   a processing unit having a first input coupled to the output of the bit shifter and having a second input coupled to the source, said processing unit having an output to which is provided a processed digital data signal corresponding to a difference between the digital data signals applied to the two processing unit inputs from the bit shifter and from the source.

4. The apparatus of claim 3 which further includes:
   delay means for providing a delay of at least one word between the digital data signals applied from the source to the bit shifter and the digital data signals applied from the source to the processing units, wherein the processing unit does not provide a difference merely between bit shifted versions of the same digital data signal from the source.

5. The apparatus of claim 3 which further includes:
   a local oscillator for producing a signal at a local oscillator frequency; and
   a frequency conversion means coupled to both the local oscillator and the processing unit for producing an output signal comprising the local oscillator signal modulated with the output signal from the processing unit.

6. The apparatus of claim 5 in which the frequency conversion means comprises a mixer.

7. The apparatus of claim 5 in which the local oscillator comprises a read only memory.

8. The apparatus of claim 7 in which the frequency conversion means comprises a mixer.

* * * * *